(12) United States Patent
Bourgeat et al.

(10) Patent No.: US 9,997,907 B2
(45) Date of Patent: Jun. 12, 2018

(54) DEVICE FOR PROTECTION AGAINST ELECTROSTATIC DISCHARGES

(71) Applicant: STMicroelectronics SA, Montrouge (FR)

(72) Inventors: Johan Bourgeat, Saint Pierre d'Allevard (FR); Boris Heitz, Grenoble (FR); Jean Jimenez, Saint Theoffrey (FR)

(73) Assignee: STMicroelectronics SA, Montrouge (FR)

( * ) Notice: Subject to any disclaimer, the term of this patent is extended or adjusted under 35 U.S.C. 154(b) by 224 days.

(21) Appl. No.: 14/964,704

(22) Filed: Dec. 10, 2015

(65) Prior Publication Data

US 2016/0380427 A1    Dec. 29, 2016

(30) Foreign Application Priority Data

Jun. 26, 2015    (FR) ...................................... 15 55921

(51) Int. Cl.
*H02H 9/04* (2006.01)
*H01L 27/02* (2006.01)

(52) U.S. Cl.
CPC ........... *H02H 9/04* (2013.01); *H01L 27/0262* (2013.01); *H01L 27/0285* (2013.01); *H02H 9/046* (2013.01)

(58) Field of Classification Search
CPC ................................. H02H 9/04; H02H 9/041

USPC .......................................................... 361/56
See application file for complete search history.

(56) References Cited

U.S. PATENT DOCUMENTS

| | | |
|---|---|---|
| 2011/0222196 A1 | 9/2011 | Smith |
| 2013/0027820 A1 | 1/2013 | Padilla et al. |
| 2013/0141823 A1 | 6/2013 | Di Sarro et al. |
| 2013/0141824 A1 | 6/2013 | Bourgeat et al. |
| 2014/0192445 A1* | 7/2014 | Ikeda ..................... H02H 9/046 361/56 |

FOREIGN PATENT DOCUMENTS

EP    2733850 A2    5/2014

OTHER PUBLICATIONS

INPI Search Report and Written Opinion for FR 1555921 dated May 18, 2016 (7 pages).

* cited by examiner

*Primary Examiner* — Dharti Patel
(74) *Attorney, Agent, or Firm* — Crowe & Dunlevy

(57) ABSTRACT

An electronic device includes first and second terminals with an electronic circuit coupled there between. The electronic circuit includes a protection circuit and a resistive-capacitive circuit. The resistive-capacitive circuit triggers the protection circuit to protect against electrostatic discharges in the presence of a current pulse between the first and second terminals. A control circuit is configured to slow down a discharge from the resistive-capacitive circuit when the protection circuit is triggered.

26 Claims, 2 Drawing Sheets

DEVICE FOR PROTECTION AGAINST ELECTROSTATIC DISCHARGES

PRIORITY CLAIM

This application claims priority from French Application for Patent No. 1555921 filed Jun. 26, 2015, the disclosure of which is incorporated by reference.

TECHNICAL FIELD

Embodiments of the invention concern electronic devices and notably those intended to protect components against electrostatic discharges (ESD).

BACKGROUND

In the field of microelectronics, an electrostatic discharge can occur throughout the life of an integrated circuit and constitute a real problem for the reliability of that integrated circuit as well as a major cause of failures.

An electrostatic discharge is generally reflected in a current peak of greater or lesser amplitude and longer or shorter duration.

An ESD protection device aims to absorb this current peak as much as possible to prevent as much as possible circulation of this current in the component or a possible voltage surge.

There are a number of possible solutions for producing a device for protection against electrostatic discharges. A hybrid MOS transistor may be used, for example, like that described in the International Application PCT/EP2011/050740 (US 2012/0141824, incorporated by reference), possibly associated with a thyristor, or a standard MOS transistor with its trigger circuit.

In some cases, the protection device is turned off and current generated by the ESD can no longer pass through it. This then results in a residual voltage surge at the terminals of the component that may damage it.

This premature turning off of the protection device can occur when the intensity of the current decreases, for example at the end of an ESD pulse or for ESD pulses of low intensity.

SUMMARY

In accordance with one embodiment, there is proposed an electronic device capable of protecting a component against electrostatic discharges while limiting as much as possible the risk of the possible occurrence of a residual voltage surge or at least reducing the level thereof below a threshold acceptable for the component to be protected.

In accordance with one aspect, there is proposed an electronic device including first and second device terminals and electronic means coupled between the two device terminals.

The electronic means include a circuit for protection against electrostatic discharges and a first resistive-capacitive circuit for triggering said protection circuit in the presence of a current pulse between the first and second device terminals.

In accordance with a general feature of this aspect, the electronic device includes a control circuit configured to slow down a discharge from the resistive-capacitive circuit when the protection circuit is in its triggered state.

The inventors have in fact observed that the occurrence of the residual voltage surge could result from the resistive-capacitive circuit discharging too rapidly when it is associated with the protection circuit to enable it to trigger.

In other words, in accordance with this aspect there is a difference compared to the prior art in that the protection circuit is allowed to remain triggered for longer, including when the intensity of the electrostatic discharge decreases.

For example, the second circuit is configured to slow down said discharge by increasing the resistive value of the resistive-capacitive circuit.

In this respect, the second circuit may include a control transistor inserted into the resistive path of the resistive-capacitive circuit and configured to be in its turned off state when the protection circuit is in its triggered state so as to increase the resistive value of the resistive-capacitive circuit.

In accordance with one embodiment, the resistive-capacitive circuit includes a capacitor coupled to said first device terminal and a first resistor coupled to the second device terminal and the control circuit includes: said control transistor connected in series between the capacitor and the first resistor, a second resistor coupled to said first device terminal, and a first transistor having a first electrode coupled to said second resistor, a second electrode coupled to said second device terminal, and a control electrode coupled to the common node between the capacitor and the control transistor, the control electrode of the control transistor being coupled to the first electrode of the first transistor, the value of the second resistor being greater than the resistive value of the first transistor when turned on, preferably a ratio of at least 6.

The control transistor and the first transistor may be NMOS transistors.

There are a number of possible embodiments for the protection circuit.

Thus the protection circuit may include a standard MOS transistor or a protection module, alone or associated with a thyristor.

The protection module may include an MOS transistor operating in a hybrid mode.

To be more precise, in accordance with one embodiment, the protection module has a first module terminal coupled to said first device terminal and a second module terminal coupled to the second device terminal and an MOS transistor having a first electrode, a second electrode, a gate and including a parasitic bipolar transistor, the MOS transistor having its first electrode coupled to the first module terminal and its second electrode coupled to the second module terminal and being further configured to function, in the presence of a current pulse between the two module terminals, in a hybrid mode including MOS type operation in a below threshold mode and operation of the parasitic bipolar transistor.

Although different configurations of the hybrid MOS transistor are possible, it is preferable, notably for reasons of stability, to choose a configuration in which the gate and the substrate of the MOS transistor are together connected to the second module terminal via a resistor that is then advantageously the first resistor of the resistive-capacitive circuit.

Thus, in accordance with one embodiment the first electrode of the MOS transistor is its drain, the gate and the substrate of the MOS transistor are both connected to the second module terminal via said control transistor and said first resistor and said capacitor of the resistive-capacitive circuit includes the drain-gate capacitance of the MOS transistor.

When the protection circuit is formed only by the protection module, the first module terminal is the first device terminal and the second module terminal is the second device terminal.

When the protection circuit includes a thyristor that can be triggered by the protection module, in accordance with one embodiment the anode of the thyristor is coupled to the first device terminal, the cathode of the thyristor is coupled to the second device terminal and the gate of the thyristor is connected to the first module terminal, the second module terminal being the second device terminal.

When the protection circuit includes a standard MOS transistor, in accordance with one embodiment the latter is coupled between the first and second device terminals and its gate is connected to the common node between said capacitor and said first resistor.

In some applications, the capacitor alone may not be sufficient to trigger the MOS transistor. In this case, the protection circuit further includes a string of inverters connected in series between said common node and the gate of the protection transistor and the control electrode of the first transistor is connected both to the control electrodes of the first inverter of the string and to the common node between the capacitor and the control transistor.

The electronic device is preferably implemented in integrated form.

BRIEF DESCRIPTION OF THE DRAWINGS

Other advantages and features of the invention emerge on reading the detailed description of non-limiting embodiments and examining the appended drawings, in which.

DETAILED DESCRIPTION

Figure 1:
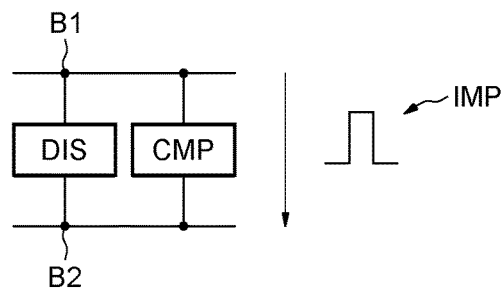
FIGS. 1 to 5 show diagrammatically embodiments of a circuit for ESD protection.

In FIG. 1, the reference DIS designates an electronic device forming a device for protecting an electronic component CMP against electrostatic discharges (ESD). The component CMP is connected to a first terminal B1 and a second terminal B2 of the device DIS.

For example, when the component CMP is operating, the terminal B1 may be connected to a positive voltage Vp and the terminal B2 may be connected to a negative voltage Vn or a voltage equal to zero (ground).

When the component CMP is not operating, it may be subjected to an electrostatic discharge typically reflected in a very short current pulse IMP (typically lasting a few microseconds) the peak current of which is of the order of 2 amperes, for example, typically occurring after 10 nanoseconds. This typically corresponds, for example, to an impulse potential difference applied between the terminals B1 and B2 via an R-L-C equivalent circuit the voltage peak of which occurs after 10 nanoseconds with an amplitude of 1 to 4 kVolts HBM, for example 4 kVolts HBM at 2.5 amperes.

The abbreviation HBM stands for "Human Body Model", a concept well known to the person skilled in the art and notably designating an electrical circuit aiming to model an electrostatic discharge delivered by a human being and routinely employed to test the sensitivity of devices to electrostatic discharges. This HBM electric circuit, which is the R-L-C equivalent circuit referred to above and to which a high voltage is applied, notably includes a 100 pF capacitor that discharges via a 1.5 kilo-ohms resistor into the device under test. In the present instance, an electrostatic discharge of 4 kilovolts HBM means that a potential difference of 4 kilovolts is applied to the HBM electric circuit.

It is then necessary for this current pulse IMP to circulate through the device DIS and not through the component CMP to be protected.

Here the device DIS aims to absorb this current pulse as much as possible and to limit the risk of a residual voltage surge occurring at the terminals of the component CMP, or at least to reduce the level thereof below a threshold acceptable for the component.

Figure 2:
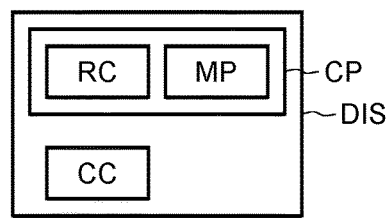

The component DIS therefore includes electronic means coupled between the two terminals B1 and B2 which, as shown in FIG. 2 in particular, include a protection circuit CP including a protection module MP associated with a resistive-capacitive circuit RC that makes it possible to detect the ESD event and to trigger the protection circuit.

As emerges hereinafter, the protection module and the resistive-capacitive circuit RC may be either separate or incorporated one in the other.

As will emerge in more detail hereinafter, the protection module may include a hybrid MOS transistor, alone or associated with a thyristor.

The protection module may alternatively be replaced by a standard MOS transistor.

The device DIS further includes a control circuit CC coupled to the circuit RC in order to limit the discharging of the capacitor of the circuit RC through the resistor of the same circuit RC and therefore to increase the time for which the protection circuit CP is in a triggered state, which makes it possible to limit the risk of a residual voltage surge occurring at the terminals of the component CMP, or at least to reduce the level thereof below a threshold acceptable for the component.

Figure 3:
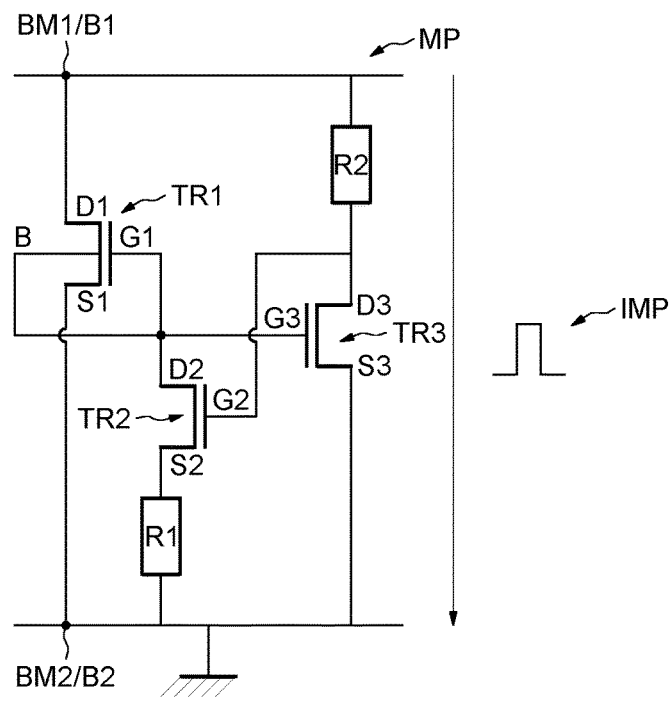

FIG. 3 shows an embodiment in which the protection module MP includes first and second module terminals BM1 and BM2 and an MOS transistor TR1 operating in a hybrid mode.

In this embodiment, the first module terminal BM1 is the first device terminal B1 and the second module terminal BM2 is the second device terminal B2.

The drain D1 of the transistor TR1 is coupled to the first terminal B1 and the source S1 of this transistor TR1 is coupled to the second terminal B2.

The transistor TR1 includes a parasitic bipolar transistor the collector of which corresponds to the drain D1 of the transistor TR1, the emitter of which corresponds to the source S1 of the transistor TR1, and the base of which corresponds to the substrate of the transistor TR1.

The transistor TR1 is configured to function, in the presence of a current pulse IMP between the two terminals B1 and B2, in a hybrid mode that includes MOS type operation in an under-threshold mode and operation of the parasitic bipolar transistor.

A number of configurations are possible for the transistor TR1, and are notably described in the application PCT/EP2011/050740 (US 2012/0141824), to which the person skilled in the art may refer.

In this embodiment, the gate G1 and the substrate B (also well known to the person skilled in the art as the "bulk") are connected and coupled to the terminal B2 by the resistor R1.

The resistive-capacitive circuit RC includes the capacitor $C_{DG}$ formed by the drain D1 and the gate G1 of the transistor TR1 and the resistor R1 coupled to the second terminal B2.

The gate-source voltage $V_{GS}$ of the MOS transistor remains below the threshold voltage VT of the transistor while there is applied between the substrate B and the source S of the transistor TR a non-zero voltage $V_{BS}$ so as to activate the parasitic bipolar transistor.

At the time of an ESD event between the first terminal B1 and the second terminal B2, the electrostatic discharge is transmitted via the drain-substrate capacitance $C_{DB}$ to the substrate of the transistor TR1 and via the drain-gate capacitance $C_{DG}$ to the gate G1 of the transistor TR1.

The presence of the capacitance $C_{DB}$, which is very large compared to the capacitance $C_{DG}$ (for example, for a 40 nanometers technology, the capacitance $C_{DB}=10^{-10}$ F/m and the capacitance $C_{DG}$ is equal to $10^{-13}$ F/m) and the connection between the substrate and the gate of the transistor TR1 enables conjugate and amplified bipolar and MOS effects to be obtained. In fact, because the capacitance $C_{DB}$ is very large compared to the capacitance $C_{DG}$, the pulse transmitted to the gate is of lower intensity than that transmitted to the substrate. The presence of the connection between the gate G1 and the substrate B enables the gate to be biased to a greater degree (by way of the pulse transmitted via the capacitance $C_{DG}$ and the pulse transmitted to the substrate) and consequently these conjugate effects to be amplified, because the closer the gate voltage is to the threshold voltage of the MOS transistor, the greater the increase in the current gain.

The control circuit CC includes a control transistor TR2 connected in series between the resistor R1 and the capacitance $C_{DG}$, its drain D2 being directly connected to the gate of the transistor TR1 and its source S2 being directly connected to the resistor R1.

It also includes a second resistor R2 that is connected directly to the first terminal B1 and directly to the gate G2 of the control transistor TR2, which is an NMOS transistor, for example.

A transistor TR3, which is an NMOS transistor, for example, is connected directly between the resistor R2 (via its drain D3) and the terminal B2 via its source S3. Its gate G3 is connected to the gate G1 of the transistor TR1.

In the absence of the control circuit CC, if the gate of TR1 were connected directly to the resistor R1, the capacitance $C_{DG}$ would discharge too rapidly via the resistor R1 and the transistor TR1 would be turned off before the end of the ESD event. The residual current of the electrostatic pulse would then cause a voltage surge at the terminals of the component.

However, in this embodiment, the gates G1 and G3 of the transistors TR1 and TR3 being connected directly, the transistor TR3 is also turned on during the pulse IMP. The gate of the transistor TR2 is therefore connected to ground, turning off the transistor TR2.

The capacitance $C_{DG}$ can therefore no longer discharge via the resistor R1 (ignoring leakage), which makes it possible for the transistor TR1 to remain turned on for longer.

It should be noted that to obtain such operation the resistive value of R2 is greater than that of the transistor TR3 when in the turned on state. For example, the resistive value of R2 is 1000Ω and that of the transistor TR3 in the turned on state is 1Ω.

Figure 4:
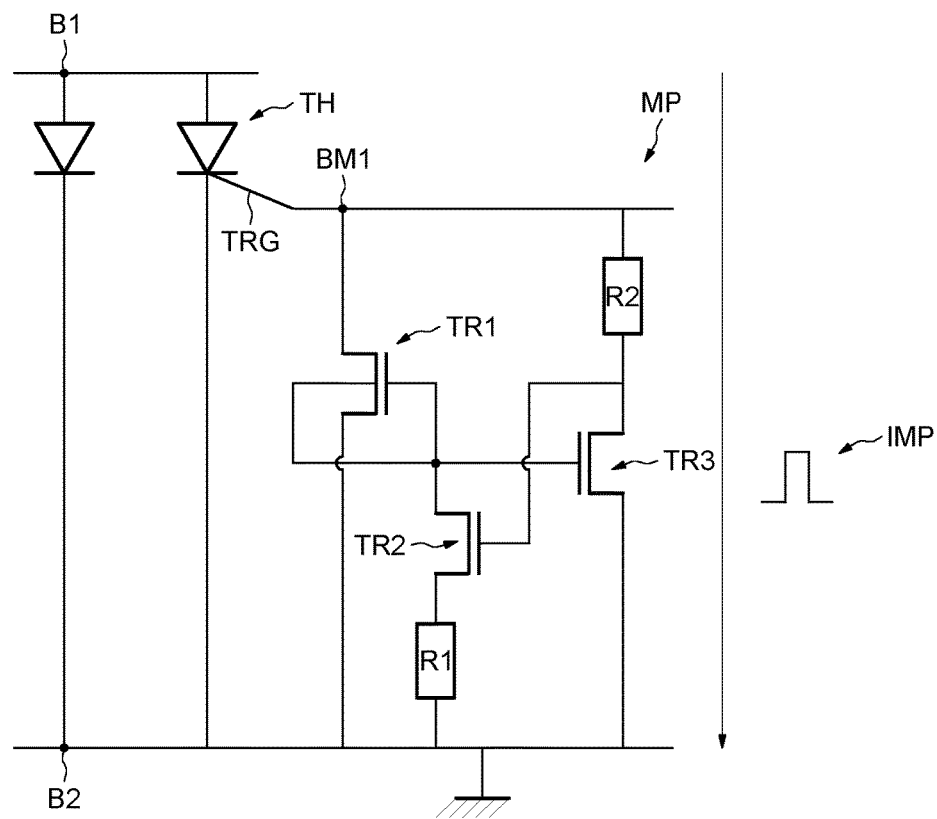

FIG. 4 shows an embodiment in which the protection circuit is coupled between the first and second device terminals B1 and B2 and includes a protection module MP as shown in FIG. 3 and a thyristor TH coupled between the first device terminal B1 and the second device terminal B2.

Here the protection module is used as a means of triggering the thyristor TH.

The first module terminal BM1 is coupled to the trigger TRG of the thyristor TH and the second module terminal is the second device terminal.

The anode of the thyristor TH is connected directly to the first device terminal B1 and the cathode is connected directly to the second device terminal B2.

A thyristor includes four semiconductor layers, alternatively P-doped and N-doped, so as to have a P-N-P-N succession between the anode and the cathode. The trigger TRG is connected here to the N layer situated between the two P layers.

When an electrostatic discharge ESD occurs between the terminal B1 and the terminal B2, the first PN junction of the thyristor is turned on and the NP junction is reverse-biased. The thyristor is therefore turned off.

The current pulse IMP therefore circulates between the anode of the thyristor TH and its trigger TRG, triggering the transistor TR1 of the protection module MP in the manner explained above. The trigger TRG is therefore pulled down to the cold point (ground), a portion of the current pulse IMP passes through the trigger TRG, which causes the NP junction to conduct at a certain level of current and consequently turns on the thyristor.

In accordance with the operating mode explained above, the control circuit makes it possible to increase the time for which the transistor TR1 is turned on by turning off the transistor TR2 and to conduct the remaining current of the pulse IMP when the thyristor TH is turned off. This current passes through the triggered TRG but is no longer high enough to trigger the thyristor again.

Figure 5:
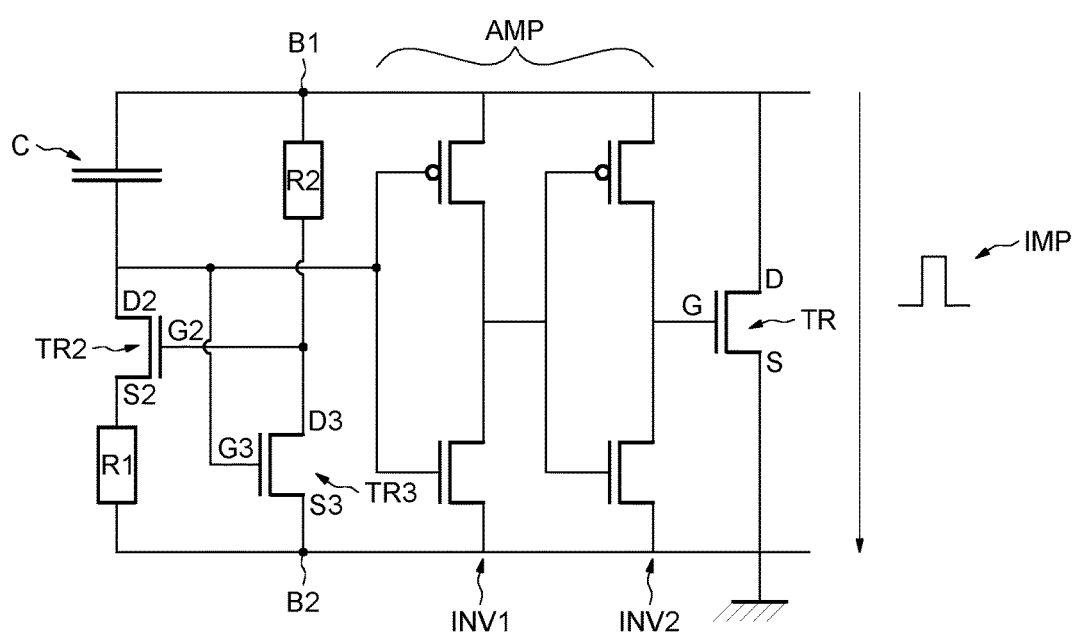

FIG. 5 shows an embodiment in which the protection circuit CP includes a transistor TR coupled between the terminals B1 and B2, for example an MOS transistor the drain D of which is connected directly to the first terminal B1 and the source S of which is connected directly to the second terminal B2.

It further includes the resistive-capacitive circuit RC including a capacitor C and a resistor R1 connected in series between the terminals B1 and B2.

It also includes a control circuit CC as shown in FIG. 3, the transistor TR2 of which is connected in series between the capacitor C and the resistor R1. The electrode of the capacitor common to the drain D2 of the transistor TR2 is connected to the input of a string AMP of MOS inverters INV1, INV2 the output of which is connected directly to the gate G of the transistor TR.

At the time of an ESD event, the current pulse IMP circulating between the first terminal B1 and the second terminal B2 is transmitted via the capacitor C and the string AMP to the gate G of the transistor TR, therefore turning it on.

The current IMP is therefore absorbed by the transistor TR.

The pulse IMP is also transmitted to the gate G3 of the transistor TR3, turning it on. The gate of the transistor TR2 is therefore grounded, turning off the transistor TR2, which (ignoring leakage) prevents the capacitor C from discharging via the resistor R1.

It should be noted here that at the time of the pulse IMP the output of the first inverter INV1 is in the low state turning on the PMOS transistor of the second inverter INV2. The pulse IMP therefore also biases the gate of the transistor TR, which efficiently contributes to turning it on.

Although embodiments have been described here involving the use of NMOS transistors, the invention is compatible with any type of MOS transistor.

The invention claimed is:
1. An electronic device, comprising:
first and second device terminals; and an electronic circuit coupled between the first and second device terminals, the electronic circuit including:
a protection circuit configured to protect against electrostatic discharges; and
a resistive-capacitive circuit configured to trigger said protection circuit in the presence of a current pulse between the first and second device terminals, the resistive-capacitive circuit including:
a capacitor coupled to said first device terminal;
a first resistor coupled to the second device terminal; and
a control circuit including a control transistor connected in series between the capacitor and the first resistor, said control transistor configured to slow down a discharge from the resistive-capacitive circuit when the protection circuit is in a triggered operating state.

2. The device according to claim 1, wherein the control circuit increases a resistive value of the resistive-capacitive circuit to slow down said discharge.

3. The device according to claim 2, wherein the control transistor is configured to be turned off when the protection circuit is in the triggered operating state so as to increase the resistive value of the resistive-capacitive circuit.

4. The device according to claim 1, further comprising:
a second resistor coupled to said first device terminal; and
a first transistor having a first electrode coupled to said second resistor, a second electrode coupled to said second device terminal, and a control electrode coupled to the common node between the capacitor and the control transistor, the control electrode of the control transistor being coupled to the first electrode of the first transistor.

5. The device according to claim 4, wherein a resistance value of the second resistor is greater than a resistance value of the first transistor when turned on.

6. The device according to claim 4, wherein a resistance value of the first resistor is greater than a resistance value of the first transistor in the conducting state by a ratio of at least 6.

7. The device according to claim 4, wherein the control transistor and the first transistor are NMOS transistors.

8. The device according to claim 1, wherein the protection circuit includes a protection module having a first module terminal coupled to said first device terminal and a second module terminal coupled to the second device terminal, and further comprising an MOS transistor having a first electrode, a second electrode, a gate and including a parasitic bipolar transistor, the first electrode coupled to the first module terminal and the second electrode coupled to the second module terminal.

9. The device according to claim 8, wherein the MOS transistor is configured to function, in the presence of a current pulse between the first and second module terminals, in a hybrid mode including MOS type operation in a below threshold mode and operation of the parasitic bipolar transistor.

10. The device according to claim 8, wherein the first electrode of the MOS transistor is a drain, wherein the gate and the substrate of the MOS transistor are both connected to the second module terminal via said control transistor and said first resistor; and wherein said capacitor includes the drain-gate capacitance of the MOS transistor.

11. The device according to claim 8, wherein the first module terminal is the first device terminal and the second module terminal is the second device terminal.

12. The device according to claim 8, wherein the protection circuit includes a thyristor that can be triggered by the protection module.

13. The device according to claim 12, wherein an anode of the thyristor is coupled to the first device terminal, a cathode of the thyristor is coupled to the second device terminal and a trigger of the thyristor is connected to the first module terminal, the second module terminal being the second device terminal.

14. The device according to claim 12, wherein the protection circuit further includes a string of inverters connected in series between said common node and the gate of the protection transistor and wherein the control electrode of the first transistor is connected both to the control electrodes of a first inverter of the string and to the common node between the capacitor and the control transistor.

15. The device according to claim 1, wherein the protection circuit includes a protection MOS transistor coupled between the first and second device terminals, the gate of the protection MOS transistor connected to the common node between said capacitor and said first resistor.

16. The device according to claim 1, implemented in integrated form.

17. A device, comprising:
a first node;
a second node;
a first transistor having a drain terminal directly connected to the first node, a source terminal directly connected to the second node and a gate terminal directly connected to a body of said first transistor;
a second transistor having a drain terminal directly connected to the gate terminal of the first transistor, a source terminal and a gate terminal;
a first resistor coupled between the source terminal of the second transistor and the second node;
a third transistor having a source terminal directly connected to the second node, a gate terminal directly connected to the gate terminal of the first transistor and a drain terminal; and
a second resistor coupled between the drain terminal of the third transistor and the first node.

18. The device of claim 17, further comprising a thyristor having a conduction terminal connected to the second node and a trigger terminal connected to the first node.

19. The device of claim 17, wherein the drain terminal of the third transistor is connected to the gate terminal of the second transistor.

20. A device, comprising:
a first node;
a second node;
a first transistor having a drain terminal directly connected to the first node, a source terminal directly connected to the second node and a gate terminal;
a second transistor having a drain terminal coupled to the gate terminal of the first transistor, a source terminal and a gate terminal;
a first resistor coupled between the source terminal of the second transistor and the second node;
a capacitor having a first terminal directly connected to the first node and a second terminal directly connected to the drain terminal of the second transistor;
a third transistor having a source terminal directly connected to the second node, a gate terminal directly connected to the drain terminal of the second transistor and a drain terminal; and
a second resistor coupled between the drain terminal of the third transistor and the first node.

21. The device of claim 20, further comprising a plurality of inverter circuits coupled in series between the drain terminal of the second transistor and the gate terminal of the first transistor.

22. The device of claim 20, wherein the drain terminal of the third transistor is connected to the gate terminal of the second transistor.

23. A device, comprising:
   a first node;
   a second node;
   a first transistor having a source-drain path connected between the first node and the second node and having a gate terminal;
   a second transistor having a source-drain path connected between the gate terminal of the first transistor and the second node, the second transistor further having a gate terminal;
   a first resistor coupled in series with the source-drain path of the second transistor;
   a third transistor having a source-drain path connected between the gate terminal of the second transistor and the second node, and having a gate terminal coupled to the gate terminal of the first transistor; and
   a second resistor coupled between the gate terminal of the second transistor and the first node.

24. The device of claim 23, further comprising a thyristor having a conduction terminal connected to the second node and a trigger terminal connected to the first node.

25. A device, comprising:
   a first node;
   a second node;
   a first transistor having a source-drain path connected between the first node and the second node and having a gate terminal;
   a second transistor having a source-drain path coupled in series with a first resistor coupled to the second node and a capacitor coupled to the first node, the second transistor positioned between the first resistor and capacitor and having a gate terminal;
   wherein the gate terminal of the first transistor is coupled to a drain terminal of the second transistor;
   a third transistor having a source-drain path connected between gate terminal of the second transistor and the second node and having a gate terminal coupled to the drain terminal of the second transistor; and
   a second resistor coupled in series with the source-drain path of the third transistor between the first node and the second node.

26. The device of claim 25, further comprising a plurality of inverter circuits coupled in series between the drain terminal of the second transistor and the gate terminal of the first transistor.

* * * * *